United States Patent
Farooq et al.

(10) Patent No.: US 9,059,167 B2
(45) Date of Patent: Jun. 16, 2015

(54) STRUCTURE AND METHOD FOR MAKING CRACK STOP FOR 3D INTEGRATED CIRCUITS

(71) Applicant: International Business Machines Corporation, Armonk, NY (US)

(72) Inventors: Mukta G. Farooq, Hopewell Junction, NY (US); John A. Griesemer, Salt Point, NY (US); William F. Landers, Wappingers Falls, NY (US); Ian D. Melville, Highland, NY (US); Thomas M. Shaw, Peekskill, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/447,710

(22) Filed: Jul. 31, 2014

(65) Prior Publication Data

US 2014/0339703 A1 Nov. 20, 2014

Related U.S. Application Data (62) Division of application No. 12/700,841, filed on Feb. 5, 2010, now Pat. No. 8,859,390.

(51) Int. Cl.
*H01L 23/522* (2006.01)
*H01L 21/768* (2006.01)
(Continued)

(52) U.S. Cl.
CPC ......... *H01L 23/5226* (2013.01); *H01L 21/2007* (2013.01); *H01L 21/76898* (2013.01); *H01L 21/78* (2013.01); *H01L 23/3114* (2013.01); *H01L 23/481* (2013.01); *H01L 23/562* (2013.01); *H01L 23/585* (2013.01);
(Continued)

(58) Field of Classification Search
CPC .............. H01L 23/562; H01L 23/5226; H01L 23/53214; H01L 23/53228; H01L 23/585; H01L 25/0657; H01L 21/76898; H01L 23/481; H01L 21/78; H01L 2924/0002; H01L 21/2007; H01L 23/3114
USPC .......................... 257/686, 777, 778, E23.169; 438/455–459
See application file for complete search history.

(56) References Cited

U.S. PATENT DOCUMENTS 4,612,083 A * 9/1986 Yasumoto et al. .............. 438/59
5,665,655 A 9/1997 White
(Continued)

OTHER PUBLICATIONS

IBM Technical Disclosure entitled "Chip Corner and Edge Reinforcement Structures to Prevent Low-k Chip Cracking", Mar. 24, 2005, IPCOM000109770D.

(Continued)

*Primary Examiner* — Mohammad Islam
*Assistant Examiner* — John P Dulka
(74) *Attorney, Agent, or Firm* — Steven M. Kellner; Catherine Ivers (57) ABSTRACT

The present invention relates to bonded semiconductor integrated circuits, more specifically to a structure to protect against crack propagation into any layer of such integrated circuits. Embodiments of the present invention may include a first semiconductor substrate having a first layer bonded to second layer of a substantially thinner second semiconductor substrate by a bonding layer. The first layer may contain a crack stop. The crack stop may be in contact with a circumferential wall, made up of posts, that extends through the bonding layer, the second layer, and the second substrate.

17 Claims, 10 Drawing Sheets

(51) Int. Cl.
*H01L 21/78* (2006.01)
*H01L 23/48* (2006.01)
*H01L 23/00* (2006.01)
*H01L 23/58* (2006.01)
*H01L 25/065* (2006.01)
*H01L 23/532* (2006.01)
*H01L 21/20* (2006.01)
*H01L 23/31* (2006.01)

(52) U.S. Cl.
CPC ... *H01L25/0657* (2013.01); *H01L 2225/06541* (2013.01); *H01L 2924/12044* (2013.01); *H01L 2924/0002* (2013.01); *H01L 23/53214* (2013.01); *H01L 23/53228* (2013.01)

(56) References Cited

U.S. PATENT DOCUMENTS

| | | | |
|---|---|---|---|
| 5,767,001 A * | 6/1998 | Bertagnolli et al. | 438/455 |
| 5,789,302 A | 8/1998 | Mitwalsky et al. | |
| 5,834,829 A | 11/1998 | Dinkel et al. | |
| 6,022,791 A | 2/2000 | Cook et al. | |
| 6,025,639 A | 2/2000 | Mitwalsky et al. | |
| 6,084,287 A | 7/2000 | Mitwalsky et al. | |
| 6,091,131 A | 7/2000 | Cook et al. | |
| 6,271,578 B1 | 8/2001 | Mitwalsky et al. | |
| 6,383,893 B1 | 5/2002 | Begle et al. | |
| 6,642,081 B1 | 11/2003 | Patti | |
| 6,650,010 B2 | 11/2003 | Davis et al. | |
| 6,815,346 B2 | 11/2004 | Davis et al. | |
| 7,098,544 B2 | 8/2006 | Edelstein et al. | |
| 7,098,676 B2 | 8/2006 | Landers et al. | |
| 7,273,770 B2 | 9/2007 | Edelstein et al. | |
| 7,335,577 B2 | 2/2008 | Daubenspeck et al. | |
| 7,521,336 B2 | 4/2009 | Daubenspeck et al. | |
| 7,521,793 B2 * | 4/2009 | Alhayek et al. | 257/712 |
| 7,544,602 B2 * | 6/2009 | Clevenger et al. | 438/619 |
| 8,158,515 B2 * | 4/2012 | Farooq et al. | 438/667 |
| 8,674,515 B2 * | 3/2014 | Farooq et al. | 257/774 |
| 2004/0101663 A1 * | 5/2004 | Agarwala et al. | 428/209 |
| 2007/0096263 A1 | 5/2007 | Furukawa et al. | |
| 2007/0145367 A1 | 6/2007 | Chen et al. | |
| 2010/0020502 A1 * | 1/2010 | Tain et al. | 361/714 |

OTHER PUBLICATIONS

Non-Final Office Action for U.S. Appl. No. 12/700,841 mailed on Nov. 7, 2013.
Final Office Action for U.S. Appl. No. 12/700,841 mailed on Apr. 11, 2014.
Notice of Allowance for U.S. Appl. No. 12/700,841 mailed on Jun. 9, 2014.
Farooq et al., U.S. Appl. No. 12/700,841, filed Feb. 5, 2010, entitled: "Structure and Method for Making Crack Stop for 3D Integrated Circuits".

* cited by examiner

STRUCTURE AND METHOD FOR MAKING CRACK STOP FOR 3D INTEGRATED CIRCUITS

BACKGROUND

The present invention relates to bonded semiconductor integrated circuits, more specifically to a structure to protect against crack propagation into any layer of such integrated circuits, and methods of manufacturing the same.

Integrated circuits are generally created by forming an array of electronic devices (i.e. transistors, diodes, resistors, capacitors, etc.) and interconnect wiring on a semiconductor substrate. Very generally, semiconductor devices and gates are formed in a first layer during front-end of the line (FEOL) processing, followed by formation of interconnect wiring in a second layer by back-end of the line (BEOL) processes. These first and second layers can each contain multiple layers of dielectric material which electrically isolate the devices and interconnecting wires. Multiple integrated circuits (ICs) can be produced simultaneously on a semiconductor wafer, and 'singulated' into individual chips by dicing. Integrated circuit technology has steadily advanced to increase the number and density of devices on a chip by decreasing the feature size. However, further advances are limited in such a 2-dimensional (2D) array as the feature size approaches the atomic scale.

An alternative approach to improve capabilities of an integrated circuit is to stack and integrate separately built 2D components, for example, a memory component bonded and integrated to a logic component, to form a three-dimensional integrated circuit (3D IC). The separate components are generally planar, each having a substrate layer and typically having devices and wiring formed in dielectric layers on one surface of the substrate. The exposed substrate surface may be considered the 'back' or the bottom, and the exposed surface of the wiring layer may be considered the 'face' or top of the component. A 3D IC can be created by bonding two or more of such components, which may be oriented 'face to face', meaning bonding the device side of each together, or 'face to back', or even 'back to back', i.e. substrate to substrate.

Bonding can be achieved by C4 adhesion, or more integrally, such as by forming an oxide-to-oxide bond that fuses silicon dioxide materials from two components. Another technique, is to fuse metal structures within the separate components, for example by contacting opposing copper pads and processing to grow copper grains across the original interface between the opposing copper pads. Regardless whether the components are 'face to face' or 'face to back', the bonded structure includes at least one BEOL layer between two semiconductor substrate layers. To enable interconnection to wiring in such an embedded BEOL layer, it is known to form a conductive structure through one of the semiconductor substrate layers, usually after thinning the substrate. Such a conductive structure is known as a 'through silicon via' (TSV). The semiconductor substrate can be thinned by grinding and chemical mechanical polishing (CMP). In contrast to a semiconductor wafer of a typical integrated circuit that may be on the order of one millimeter thick or, for example, about 785 um thick, thinning may substantially reduce the substrate thickness to only about 10 microns, or between 5 and 25 microns, which is similar to the thickness of the BEOL layer.

3D ICs can be formed by bonding chips before or after dicing, i.e., die to die, die to wafer, or wafer to wafer. Greater throughput would be achieved by forming 3D ICs at the wafer scale, but subsequently singulating the composite can damage many of the dice, reducing the yield. During dicing, forces applied to the chip edge via friction with the dicing blade can result in local chip edge damage such as small cracks or delaminations. When a chip is subsequently mounted in a package, thermal expansion mismatch between packaging materials and the chip can result in long range stress fields that can drive dicing flaws into the active area of the chip resulting in circuit failure. This problem can be addressed in typical 2D integrated circuits by forming a narrow region that is continuous around the periphery the chip such as a metal wall to block propagation of a crack, i.e., a crack stop. Such structure can be included at all FEOL and BEOL levels so it extends continuously through all the layers formed on the substrate such that a crack cannot circumvent the crack stop along an alternate parallel weaker path.

There is currently no good technique for including such a crack stop structure across the bonded interface between components in a 3D IC. This interface may be weakly bonded or formed within low toughness brittle materials, making the bonded region especially susceptible to damage during dicing. Also, the substrate layer of at least one of the bonded components in a 3D structure is typically thinned for purposes of 3D integration. The thinning process can produce dislocations or other flaws in the substrate, in addition to damage caused by dicing. Edge damage to a bonded region or to a thinned substrate layer may propagate as cracks into the electrically active region and cause failure of the 3D structure. A 3D IC that is more resistant to damage during dicing is needed.

SUMMARY

According to one embodiment, the structure of the present invention includes a first component having a first semiconductor substrate and a first layer with first metallization formed therein, which first component is bonded at a bonding layer to a second component having a second semiconductor substrate and a second layer with second metallization formed therein. The composite structure has an active area and a periphery; and includes a circumferential wall through the bonding layer and adjacent to the periphery. In some embodiments, the structure includes a TSV. The circumferential wall can be formed by filling a pattern of holes or a continuous trench with a tough material, which material can be the same as that of such TSV.

According to a second embodiment, the structure of the present invention includes a first component having a first semiconductor substrate and a first layer having first metallization formed therein. The first component is bonded to a second component having a thinned semiconductor substrate to form a composite structure, said thinned semiconductor substrate having a periphery, and having an active region and an annular inactive region adjacent to the periphery. The composite structure includes a circumferential wall formed through the thinned semiconductor substrate such that a straight line through the periphery into the active region necessarily intersects the circumferential wall.

In another aspect of the invention a method is disclosed. The method includes providing a bonded structure that has a bonding layer between a first component and a second component, where the components each have a semiconductor substrate and a layer with metallization formed therein, and the semiconductor substrate of the second component is substantially thinner than the first semiconductor substrate. The method also includes forming a circumferential wall through such bonding layer and adjacent to the periphery of the bonded structure. The method can include bonding the first and second components by adhesion of dielectric materials or by metal to metal fusion, and forming the circumferential wall before or after bonding the components together. The method can also include forming one or more TSVs and the circumferential wall simultaneously.

Additional features and advantages are realized through the techniques of the present invention. Other embodiments and aspects of the invention are described in detail herein and are considered a part of the claimed invention. The present invention will be understood and appreciated more fully from the following detailed description of the invention, taken in conjunction with the accompanying drawings.

It will be appreciated that for simplicity and clarity of illustration, elements shown in the drawings have not necessarily been drawn to scale. For example, the dimensions of some of the elements may be exaggerated relative to other elements for clarity.

DETAILED DESCRIPTION

Figure 1:
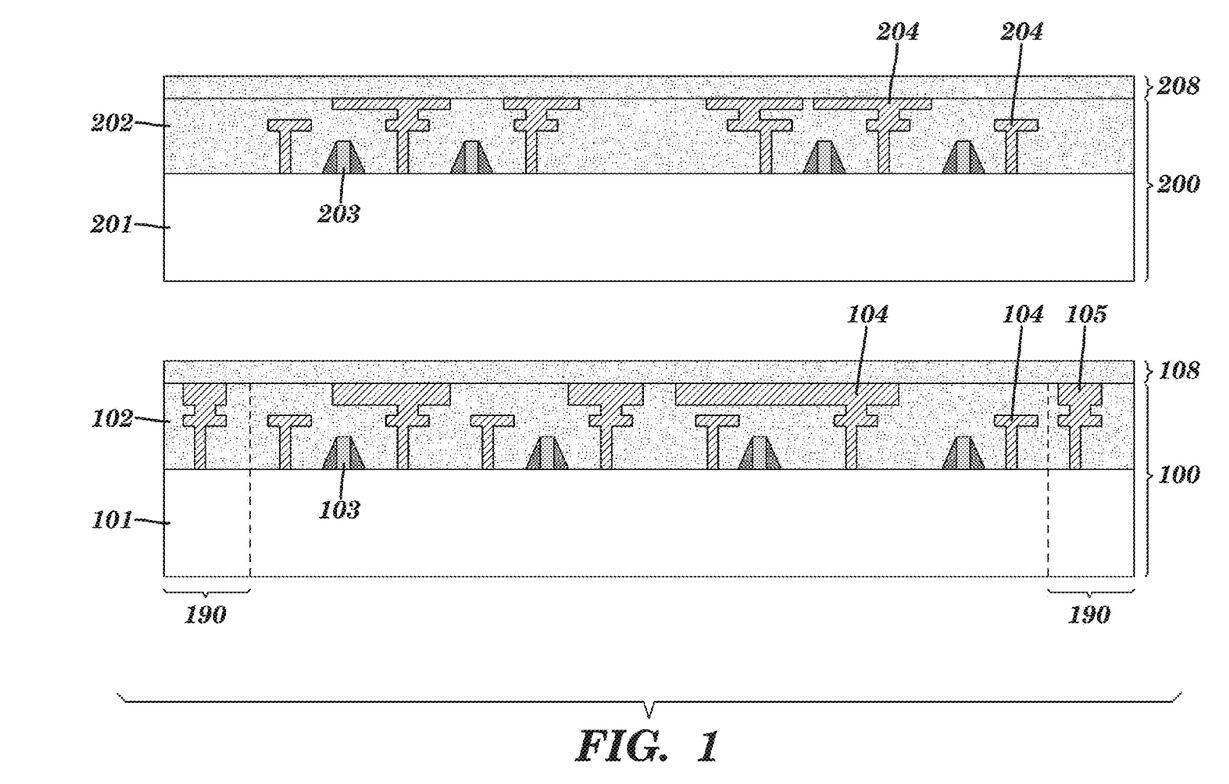
FIG. 1 is a sectional view of two components at a stage of fabricating a 3D IC in accordance with a first embodiment of the invention.

In accordance with the present invention, a 3D IC crack stop that extends through the entire periphery including the bonding layer is disclosed, as well as a method for creating such a crack stop. FIG. 1 illustrates exemplary components 100 and 200 that can be bonded to form a 3D IC in accordance with a first embodiment of the invention. Component 100 includes a semiconductor substrate 101 in which can be formed one or more semiconductor device such as a transistor, diode, resistor, capacitor, varactor, inductor, or a carbon nanotube or other nanoscale device. Gate structures 103 are typically formed in a FEOL layer (not shown). Interconnect metallization 104 is embedded during BEOL processing in sequentially applied insulating layers (collectively layer 102). Interconnect metallization 104 includes wires (within an insulating layer) and vias (connecting wires in different insulating layers). Interconnect metallization 104 provides electrical connection to or between semiconductor devices in component 100.

The components used to form a 3D IC are planar structures having a generally planar top and bottom surface substantially parallel to the substrate layer, and side surfaces comprising a periphery. The semiconductor devices and interconnect metallization are formed within an active region of the component. The peripheral surface forms the outer surface of an annular inactive region that surrounds such active region. FIG. 1 illustrates annular inactive region 190 of component 100. Wall 105 is in the annular inactive region and is optionally built of the same materials and at the same time as interconnect metallization 104.

Component 200 similarly includes semiconductor substrate 201 on which gate structures 203 can be formed, and interconnect metallization 204 formed within layer 202. Note that in this embodiment, component 200 does not include a structure analogous to wall 105.

Interconnect metallization 104 and 204 may be formed of any conductive metal such as Al, Cu, Tungsten, or alloys thereof. Wall structure 105 may be formed of the same conductive metals as interconnect metallization 104 or of any other material that can stop crack propagation including a plastic material such as polyimide or even an air gap.

Each of semiconductor substrate 101 and semiconductor substrate 201 includes a semiconductor material. Preferably, the semiconductor material can be a single crystalline semiconductor material having perfect epitaxial alignment within the entire top layer. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor substrates may comprise single crystalline silicon.

The insulating layers 102 and 202 include at least one dielectric material and can include a plurality of dielectric material layers having different compositions. Layers 102 and 202 can include any dielectric material known in semiconductor processing technology, which can be a doped or undoped silicate glass, silicon nitride, a low dielectric constant (low-k) chemical vapor deposition (CVD) material such as organosilicate glass, a low-k spin-on dielectric material such as SiLK™, BLoK™, NBLoK™, or any other type of dielectric material that can be deposited or formed on a substrate and is able to hold at least one metal pad therein. As is known in the art, layers 102 and 202 can also include materials for various purposes such as to act as an etch stop or to mitigate electromigration of conductive materials.

Figure 2A:
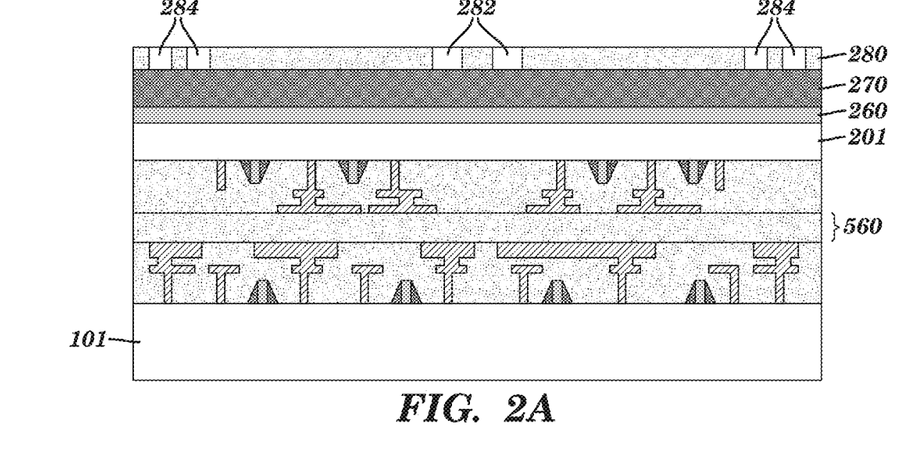
FIGS. 2A and 2B are respectively a sectional view and a plan view of the components of FIG. 1 at a subsequent stage in accordance with a first embodiment of the invention.

Component 100 can be bonded to component 200 to form a composite by applying adhesion layer 108 over layer 102, applying adhesion layer 208 over layer 202, contacting components 100 and 200 face to face as shown in FIG. 2A, and fusing adhesion layers 108 and 208 to form bonding layer 560. Optionally, either or both adhesion layers 108 and 208 could be formed as a last step of BEOL processing. To form the composite by dielectric to dielectric adhesion, each of adhesion layer 108 and adhesion layer 208 includes a dielectric material such as silicon oxide, silicon nitride, silicon oxynitride, organosilicate glass (OSG), or any other dielectric material that can be employed for layers 102 or 202. Optionally, the material of adhesion layer 208 is the same as the material of adhesion layer 108, for example, silicon dioxide. Dielectric to dielectric adhesion could alternatively bond components in 'face to back' orientation such as by forming adhesion layer 108 over layer 102, forming an adhesion layer on the back of semiconductor substrate 201, contacting the back of component 200 to the front of component 100, and fusing the adhesion layers to form a bonding layer.

Returning to the embodiment of FIG. 2A, semiconductor substrate 201, which in this embodiment forms the top surface of the composite 3D IC, can be substantially thinned by grinding, wet or dry etching, and/or CMP. Semiconductor substrate 201 may be reduced to a thickness of 100 um or less. It may be preferable to reduce the thickness to between 40 and 80 um, or even to a thickness similar to that of BEOL/FEOL layers, such as, between about 25 and 5 um.

A passivation layer 260 is applied over thinned substrate 201. The passivation layer 260 can be patterned by conventional methods using photoresist layer 280 and optionally hardmask layer 270. Passivation layer 260 can be, any of the aforementioned dielectric materials, such as silicon nitride or silicon dioxide. Hardmask layer 270 can be an oxide film, doped oxide film, or other material known in the art.

Figure 2B:
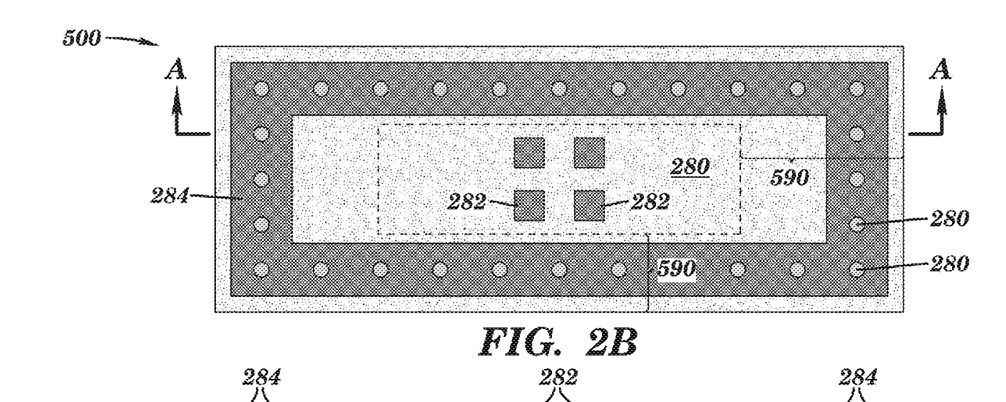

FIG. 2A is a cross section of the composite at section A-A of FIG. 2B. FIG. 2B is a top view of a stage of forming a 3D IC 500 which has wiring and circuitry within an active region surrounded by an annular inactive region 590 adjacent to the periphery of component 500. Photoresist layer 280 can be patterned to form opening 284 for a continuous wall or crack stop within annular region 590. FIG. 2B depicts a pattern that also includes optional openings 282 for TSVs within the active region.

Figure 7A:
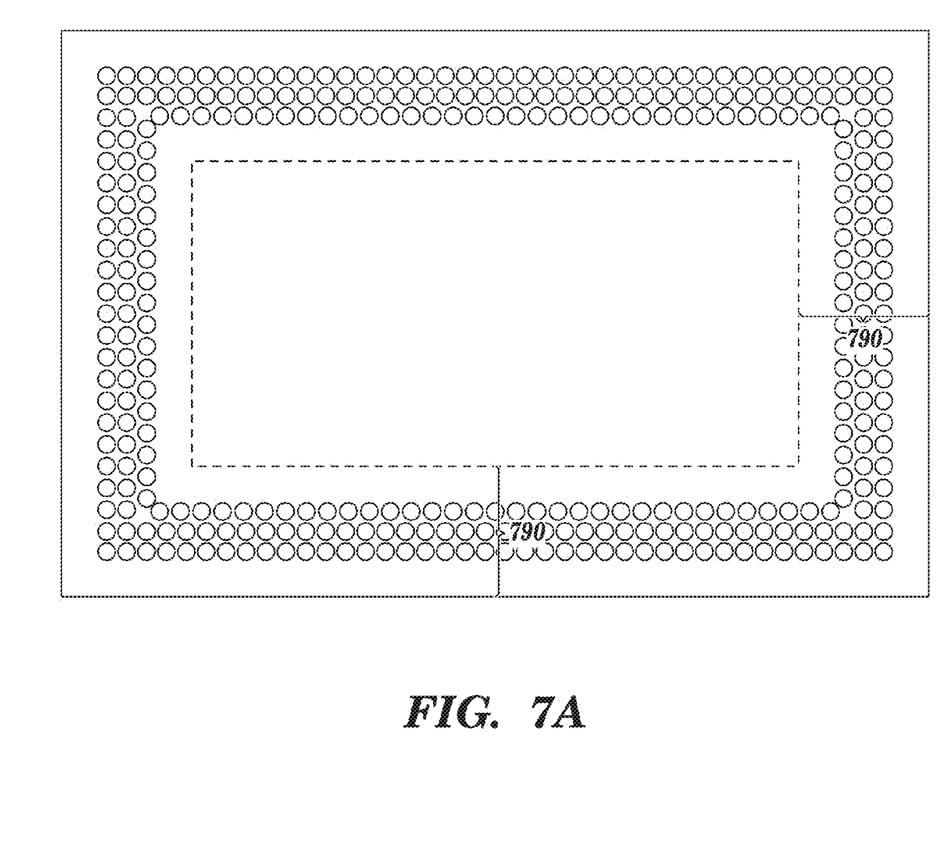
FIG. 7A-D illustrates exemplary patterns of a crack stop of the present invention.
Figure 7B:
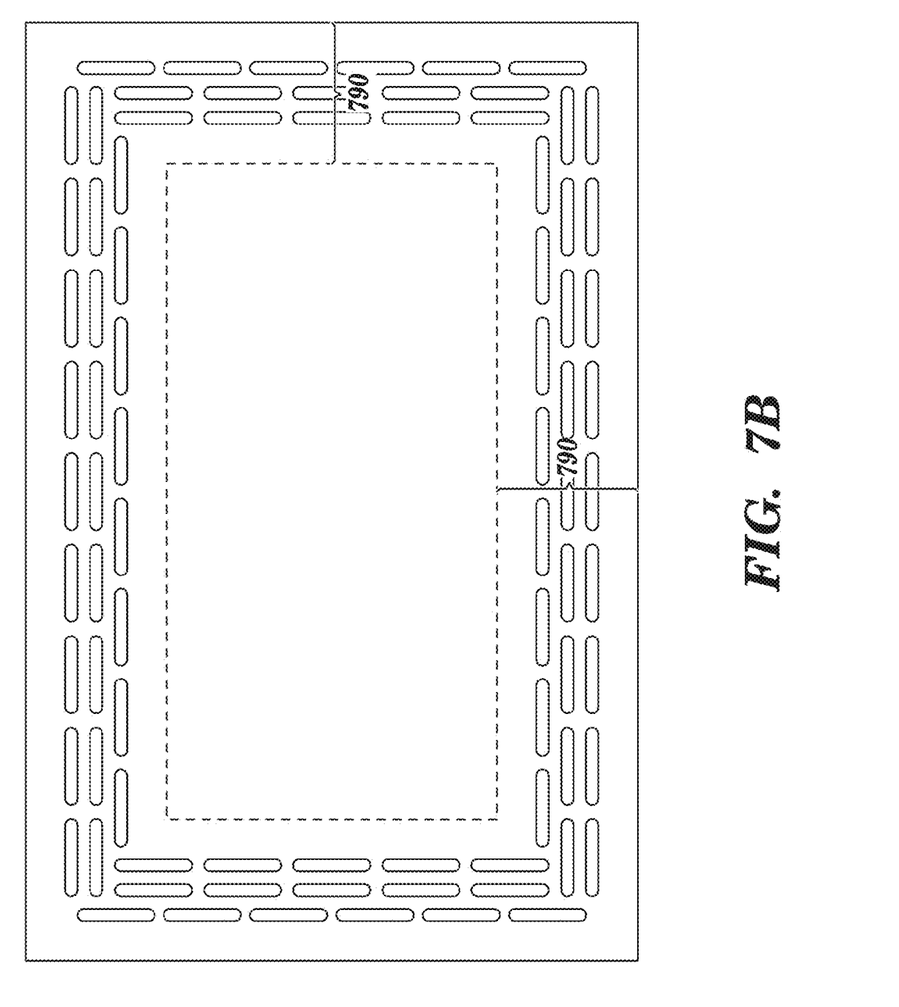
Figure 7C:
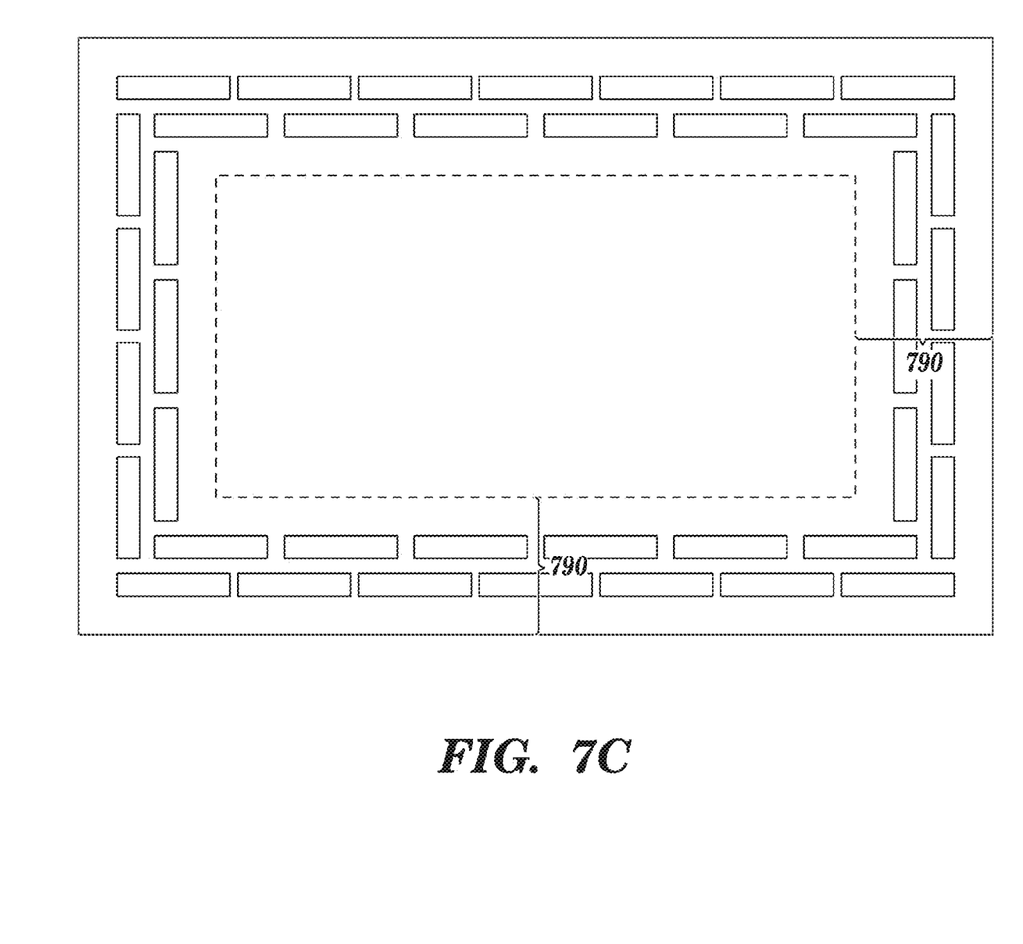
Figure 7D:
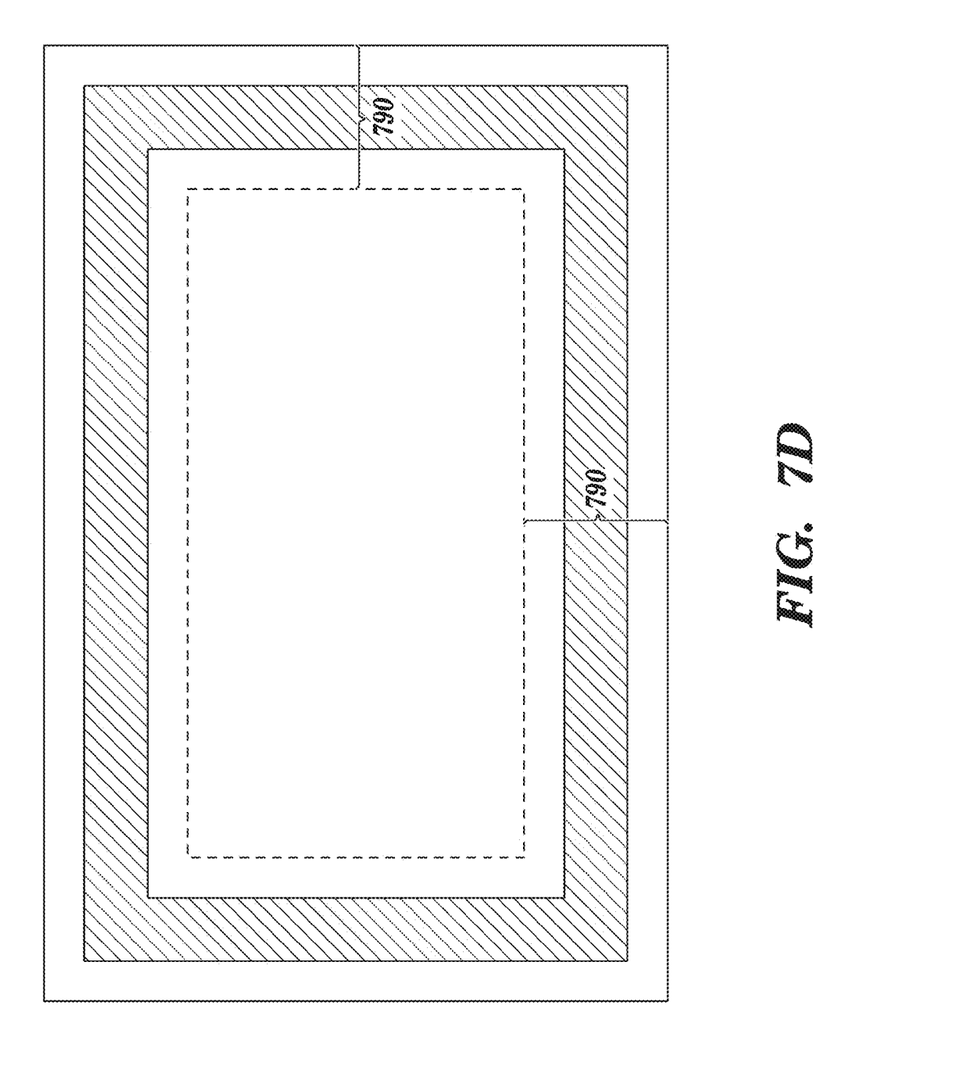

The crack stop pattern of FIG. 2B is but one of many patterns that can be employed. The continuous wall may be formed within a continuous annular trench adjacent the periphery of the 3D IC and having depth generally perpendicular to the substrate layer 201. According to the pattern of FIG. 2B, portions of photoresist 280 may be left within the trench opening, which upon etching can result in posts within the trench. Other patterns for the crack stop can be employed within the scope of the invention. By way of example, FIGS. 7A to 7D illustrate patterns for a continuous wall in the annular inactive region 790 at the periphery of a chip. In FIGS. 7A, 7B, and 7C, rather than a trench, the continuous wall comprises a set of holes (which may be filled to form posts), the holes extending generally perpendicular to the substrate layers of a 3D IC and parallel to each other, the holes arranged in several rows adjacent to the periphery, the holes and rows so shaped and spaced that a straight line passing from outside the chip through the periphery and the wall and into the conductively active region of the chip necessarily intersects at least one hole. The patterns of FIGS. 7A through 7C illustrate several rows of holes, each row forming a rectangle in the peripheral region of a chip, but shapes other a simple rectangle can be employed. Also, the holes illustrated in FIGS. 2B and 7A have a circular cross section, but other shapes can be suitable, for example, an irregular shape, or as per FIG. 7B or 7C, an elliptical or rectilinear shape. A continuous wall can alternately be formed according to the pattern of FIG. 7D, which illustrates a continuous trench with no posts.

Figure 3:
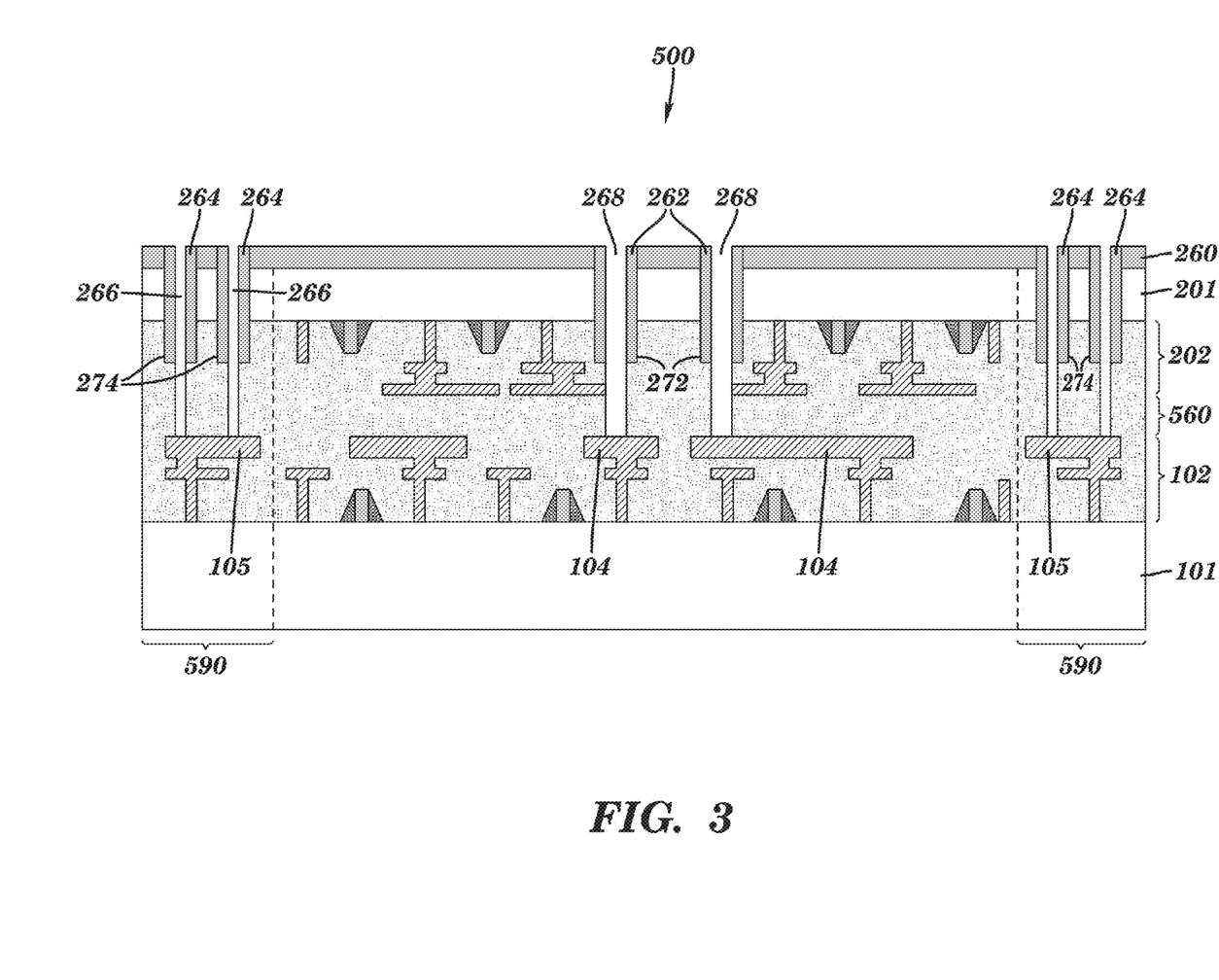
FIG. 3 is a sectional view of the structure of the invention in accordance with a first embodiment of the invention.

FIG. 3 illustrates further processing to form the crack stop in composite 500 according to the first embodiment. Using conventional methods, photoresist layer 280 can be removed after the crack stop pattern is etched through hardmask layer 270 and passivation layer 260. Optionally, and particularly if the lateral dimensions of the TSVs are on the same scale as those of opening 284, the crack stop can be formed simultaneously and by the same etching and processing steps used to form the TSVs. In such a case, crack stop opening 284 and TSV opening 282 (see FIG. 2B) can be continued through substrate 201 by reactive ion etch (RIE) forming holes 274 and 272. If necessary to separate the material of the crack stop and/or TSVs from the substrate, sidewall coatings 264 and 262 can be deposited. The sidewall coating can be formed using any material appropriate for passivation layer 260. The coating, if present, narrows the openings through substrate 201. Further RIE can extend these openings through layer 202, and through bonding layer 560. The extension of opening 274 can expose wall 105 and the extension of opening 272 can expose interconnect metallization 104. Optionally, that extended opening 274 can be filled by a material with high toughness, such as a ductile metal or a plastic. A circumferential wall 266 or crack stop is thereby formed adjacent to the periphery, encompassing the active region of component 500 and extending from the top surface, through thinned substrate 201, through layer 202, and through bonding layer 560 of component 500. Optionally, openings 274 and 272 are filled simultaneously with a conductive metal such as copper to form TSVs 268 and circumferential wall 266. Preferably, circumferential wall 266 lands on wall 105, thereby forming a continuous wall which extends through annular region 590 extending from the top surface of component 500 through adhesion layer 560 and layer 102 to semiconductor substrate 101.

Component 100 can be one of a plurality of identical components formed on a first wafer. Similarly component 200 can be one of a plurality of identical components formed on a second wafer. A plurality of components identical to component 500 can be formed by aligning and bonding each component on the second wafer to a component on the first wafer. After processing to form a crack stop, for example in accordance with the embodiment of FIGS. 1 to 3, the plurality of components 500 can be 'singulated' into individual chips by dicing.

Figure 4A:
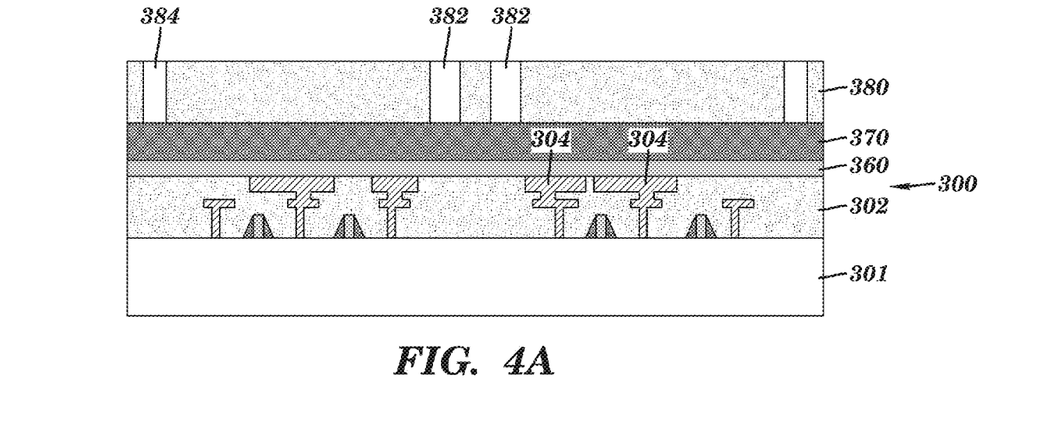
FIGS. 4A and 4B are respectively a sectional view and a plan view of a component of a 3D IC in accordance with a second embodiment of the invention.
Figure 4B:
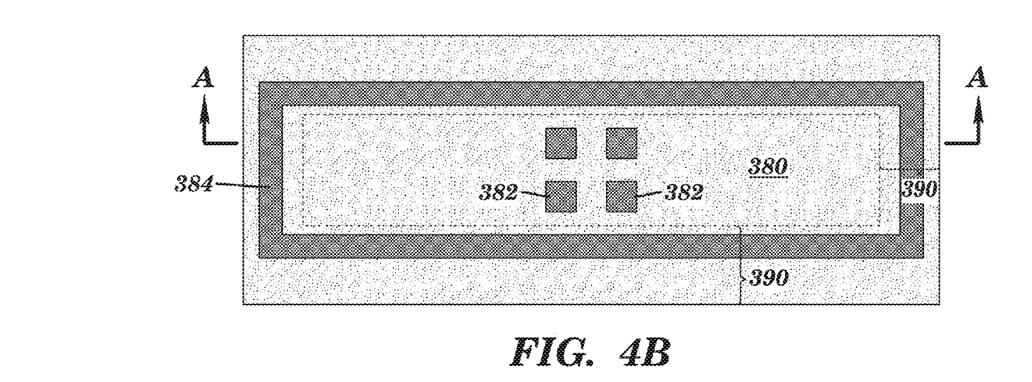
Figure 5:
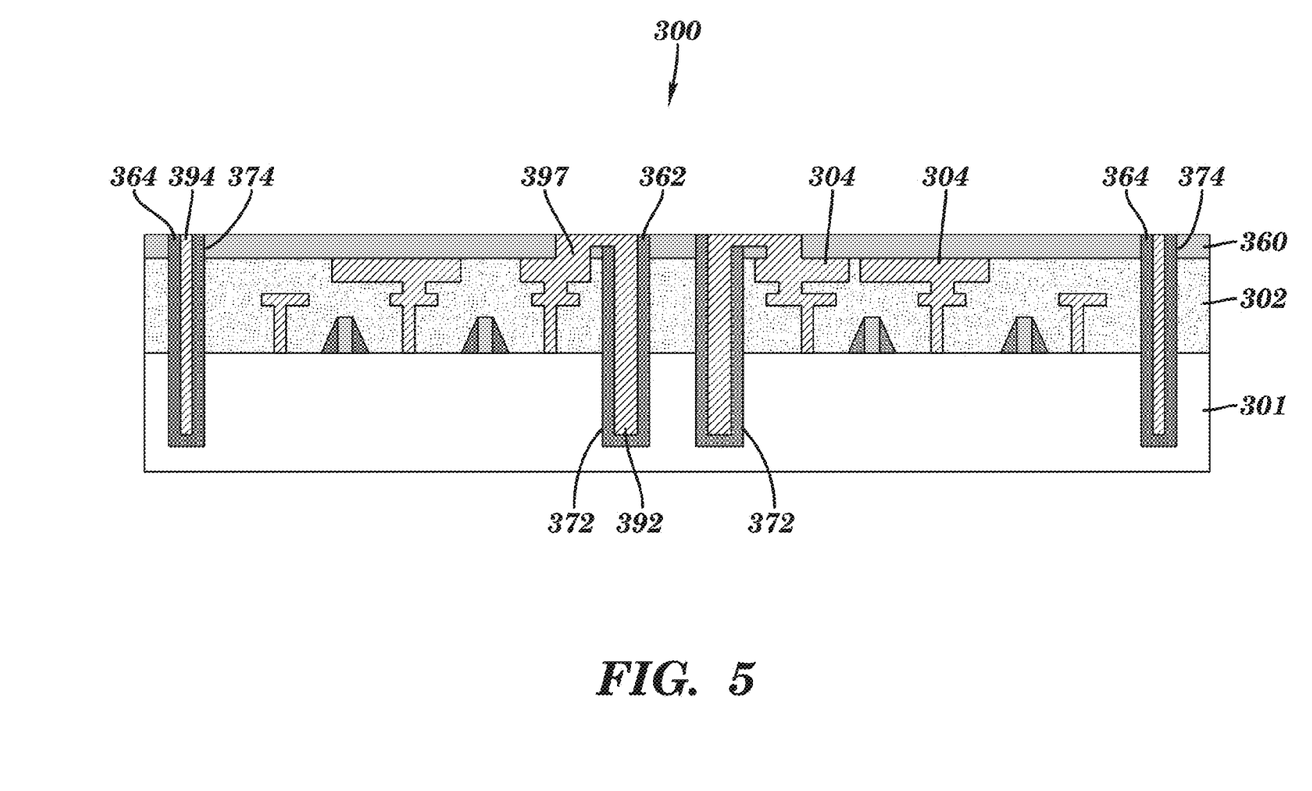
FIG. 5 is a sectional view of the component of FIG. 4A at a subsequent stage in accordance with a second embodiment of the invention.
Figure 6:
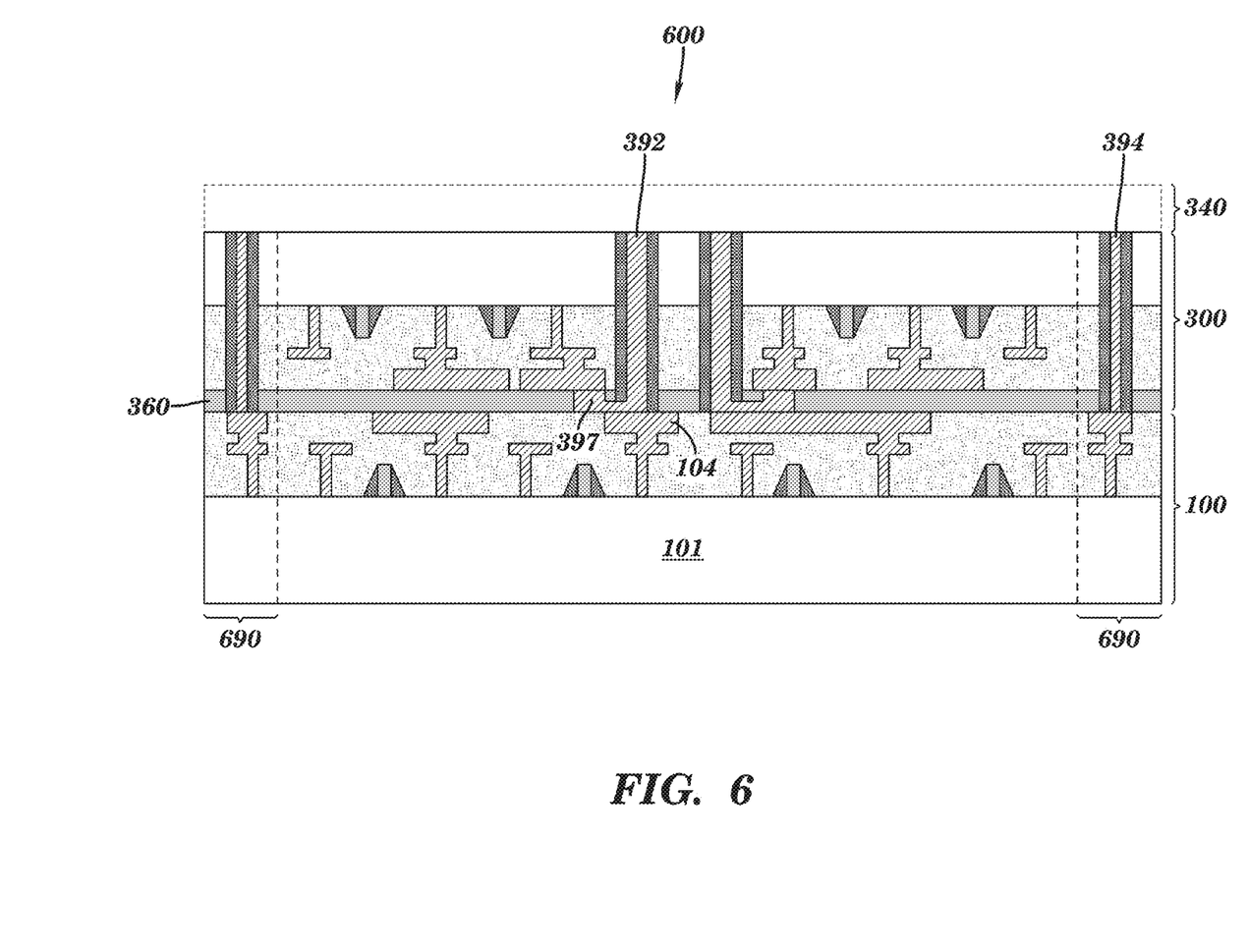
FIG. 6 is a sectional view of the structure of the invention in accordance with a second embodiment of the invention.

A second embodiment of the invention is illustrated by FIGS. 4 to 6. FIG. 4A is a cross sectional view of component 300 which can be formed by further processing of component 200. As such, elements 301, 302, and 304 of component 300 are, respectively, analogous to elements 201, 202, and 204 of component 200. Passivation layer 360 can be applied over the top surface of layer 302 to form an insulating layer over interconnect metallization 304. Passivation layer 360 can optionally be formed during BEOL processing of component 200. Passivation layer 360 can be patterned by conventional means and materials using photoresist layer 380 and optionally hardmask layer 370.

FIG. 4A is a cross sectional view of component 300 at section A-A of FIG. 4B. FIG. 4B is a top view of component 300 which has wiring and circuitry within an active region surrounded by an annular inactive region 390. Photoresist layer 380 can be patterned to form a continuous trench 384 which can be filled to form a circumferential wall or crack stop in annular region 390 and peripheral to the active region of component 300. Numerous patterns are appropriate to form the circumferential wall as noted previously. The wall can be formed in a continuous trench, with or without posts within the trench, or as rows of posts (or holes) spaced such that a straight line through the wall must necessarily intersect a post (or hole). The pattern of FIG. 4B also includes optional openings 382 for TSVs within the active region. Optionally, and particularly if the lateral dimensions of the TSVs are on the same scale as those of the crack stop, the crack stop can be formed simultaneously and by the same etching and processing steps used to form the TSVs.

FIG. 5 illustrates further processing according to the second embodiment. Using conventional methods such as RIE, the pattern of FIG. 4B can be etched through passivation layer 360 and can be continued to extend the pattern through layer 302 and into substrate 301 to form wall opening 374 and optionally TSV openings 372. If necessary, sidewall coating 364 may be applied to separate the crack stop material from the substrate. A sidewall coating 362 is generally necessary to separate the TSV material from substrate 301. A circumferential wall or crack stop 394 can be formed adjacent to the periphery and encompassing the active region of component 300 by filling wall openings 374. Opening 374 may be filled by electroplating Cu, in which case, as is known, a TaN/Ta barrier/adhesion layer (not shown) and a seed layer (not shown) may be deposited before such filling step. After openings 372 are filled, TSVs 392 and interconnect metallization 304 can be contacted by metallization 397 using standard BEOL methods.

FIG. 6 illustrates the completed 3D IC 600 according to this second embodiment. Component 300 of FIG. 5 is flipped over and aligned on component 100. The components are bonded by metal-to-metal adhesion by fusing metallization 397 to interconnect metallization 104 whereby passivation layer 360 constitutes a bonding layer. A continuous wall in the annular region 690 around the active region of the 3D IC extending through the bonding layer can be formed by fusing crack stop 394 to wall 105. Optionally, such fusing of metallization 397 and crack stop 394 occurs simultaneously. A thickness 340 of the substrate of component 300 can be removed by etching, grinding and/or CMP to expose TSVs 392 and wall 394, at which point the continuous wall extends completely through the thinned substrate layer, and from the thinned substrate though all intervening layers including the bonding layer to the bottom substrate 101 of the 3D IC.

The description is presented for purposes of illustration, but is not intended to be exhaustive or to limit the invention in the form disclosed. For example, FIGS. 3 and 6 illustrate embodiments of the 3D IC of the present invention as two components bonded together, but the invention also contemplates 3D ICs formed of three or more components bonded together. Many modifications and variations will be apparent to those of ordinary skill in the art without departing from the scope and spirit of the invention.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A structure comprising:
a bonded structure comprising a first component bonded to a second component by a bonding layer, said first component having a first semiconductor substrate and a first layer with first metallization formed therein, said second component having a second semiconductor substrate that is substantially thinner than the first semiconductor substrate and a second layer with a second metallization formed therein, said bonding layer comprising a first adhesion layer formed on the first layer and a second adhesion layer formed on the second layer, and said bonded structure having a periphery around an active region;
a crack stop in the first layer;
a passivation layer on an outer surface of the second semiconductor substrate; and
one or more posts extending through the passivation layer, the second semiconductor substrate, the second layer, and the bonding layer, wherein the one or more posts comprise a circumferential wall adjacent to the periphery, and wherein the circumferential wall is in contact with the crack stop.

2. The structure of claim 1 further comprising a first wafer, said first wafer comprising a plurality of said first component.

3. The structure of claim 2 further comprising a second wafer, said second wafer comprising a plurality of said second components, each of said plurality of second components bonded to one of said plurality of first components.

4. The structure of claim 1 wherein the first adhesion layer and the second adhesion layer comprise dielectric materials.

5. The structure of claim 1 wherein said bonding layer comprises a third metallization and includes an interface formed by fusing said third metallization to a portion of said first metallization.

6. The structure of claim 1 wherein said circumferential wall consists essentially of one or more of copper, copper alloy, tungsten, tungsten alloy, aluminum, and aluminum alloy.

7. The structure of claim 1 wherein a coating layer separates said circumferential wall and said second semiconductor substrate.

8. The structure of claim 1 wherein said circumferential wall comprises a continuous trench, said continuous trench having a depth generally perpendicular to said second semiconductor substrate.

9. The structure of claim 1 wherein said circumferential wall comprises two or more rows of posts, said posts extending generally perpendicular to said second semiconductor substrate and being generally parallel to each other, said posts and rows spaced such that a straight line into said active region and through a) the periphery of said bonded layer or b) the periphery of said second semiconductor substrate necessarily intersects at least one said post.

10. A structure comprising:
a first component having a first semiconductor substrate and a first layer with a first metallization formed therein;
a second component bonded to said first component by a bonding layer, the second component having a second semiconductor substrate that is substantially thinner than the first semiconductor substrate and a second layer with a second metallization formed therein, the bonding layer comprising a first adhesion layer on the first layer joined to a second adhesion layer on the second layer, the second component having a periphery adjacent to an annular inactive region that surrounds an active region; and
one or more posts extending through an entire thickness of the second adhesion layer and an entire thickness of the second layer, wherein the one or more posts comprise a circumferential wall adjacent to the periphery.

11. The structure of claim 10 further comprising a first wafer, said first wafer comprising a plurality of said first component.

12. The structure of claim 11 further comprising a second wafer, said second wafer comprising a plurality of said second components, each of said plurality of second components bonded to one of said plurality of first components.

13. The structure of claim 10 wherein the first adhesion layer and the second adhesion layer comprise dielectric materials.

14. The structure of claim 10 wherein said bonding layer comprises a third metallization and includes an interface formed by fusing said third metallization to a portion of said first metallization.

15. The structure of claim 10 wherein said circumferential wall consists essentially of one or more of copper, copper alloy, tungsten, tungsten alloy, aluminum, and aluminum alloy.

16. The structure of claim 10 wherein said circumferential wall comprises a continuous trench, said continuous trench having a depth generally perpendicular to said second semiconductor substrate.

17. The structure of claim 10 wherein said circumferential wall comprises two or more rows of posts, said posts extending generally perpendicular to said second semiconductor substrate and being generally parallel to each other, said posts and rows spaced such that a straight line into said active region and through a) the periphery of said bonded layer or b) the periphery of said second semiconductor substrate necessarily intersects at least one said post.

* * * * *